(12) United States Patent
Ahn et al.

(10) Patent No.: US 12,604,465 B2
(45) Date of Patent: Apr. 14, 2026

(54) SEMICONDUCTOR DEVICE

(71) Applicant: SAMSUNG ELECTRONICS CO., LTD., Suwon-si (KR)

(72) Inventors: Junhyeok Ahn, Suwon-si (KR); Sohyun Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 303 days.

(21) Appl. No.: 18/376,022

(22) Filed: Oct. 3, 2023

(65) Prior Publication Data

US 2024/0130116 A1 Apr. 18, 2024

(30) Foreign Application Priority Data

Oct. 12, 2022 (KR) ........................ 10-2022-0130711

(51) Int. Cl.
H10B 12/00 (2023.01)

(52) U.S. Cl.
CPC .......... H10B 12/482 (2023.02); H10B 12/02 (2023.02); H10B 12/315 (2023.02); H10B 12/485 (2023.02)

(58) Field of Classification Search
CPC .... H10B 12/482; H10B 12/02; H10B 12/315; H10B 12/485; H10B 12/053; H10B 12/0335; H10B 12/31; H10B 12/50; H10B 12/34
See application file for complete search history.

(56) References Cited

U.S. PATENT DOCUMENTS

| | | | |
|---|---|---|---|
| 8,878,293 B2 | 11/2014 | Jang et al. | |
| 9,230,612 B2 | 1/2016 | Park | |
| 9,520,348 B2 | 12/2016 | Choi et al. | |
| 2011/0037111 A1 | 2/2011 | Kim et al. | |
| 2016/0027786 A1 | 1/2016 | Kim et al. | |
| 2021/0366911 A1 | 11/2021 | Yen | |
| 2022/0115382 A1* | 4/2022 | Lee ...................... | H10B 12/482 |

FOREIGN PATENT DOCUMENTS

| | | |
|---|---|---|
| KR | 1020100134230 A | 12/2010 |
| KR | 1020160021962 A | 2/2016 |
| KR | 1020220006782 A | 1/2022 |

* cited by examiner

*Primary Examiner* — Mohammad A Rahman
(74) *Attorney, Agent, or Firm* — Muir Patent Law, PLLC

(57) ABSTRACT

A semiconductor device includes a substrate having an active region; a bit line structure on the substrate and extending in one direction; a bit line contact electrically connecting a first impurity region of the active region and the bit line structure; and a storage node contact disposed on a sidewall of the bit line structure and electrically connected to a second impurity region of the active region, wherein the storage node contact includes a vertical extension portion extending in a vertical direction, perpendicular to an upper surface of the substrate, and a horizontal extension portion integrally connected to the vertical extension portion and extending in a horizontal direction, parallel to the upper surface of the substrate.

20 Claims, 17 Drawing Sheets

B

B

B

<u>B</u>

B

B

SEMICONDUCTOR DEVICE

CROSS-REFERENCE TO RELATED APPLICATION

This application claims benefit of Korean Patent Application No. 10-2022-0130711, filed on Oct. 12, 2022, in the Korean Intellectual Property Office, the disclosure of which is incorporated herein by reference in its entirety.

BACKGROUND

1. Field

Embodiments relate to a semiconductor device.

2. Description of the Related Art

Electronic devices are being further miniaturized with high performance according to the development of the electronic industry and the needs of users. Accordingly, semiconductor devices used in electronic devices are also required to be highly integrated and have high performance. In order to manufacture a high-performance semiconductor device, a technique capable of minimizing parasitic capacitance between adjacent conductive structures is required to minimize degradation of signal transmission speed due to RC delay.

SUMMARY

According to an aspect of embodiments, a semiconductor device includes a substrate including an active region; a bit line structure on the substrate and extending in one direction; a bit line contact electrically connecting a first impurity region of the active region and the bit line structure; and a storage node contact on a sidewall of the bit line structure and electrically connected to a second impurity region of the active region, wherein the storage node contact includes a vertical extension portion extending in a vertical direction, perpendicular to an upper surface of the substrate, and a horizontal extension portion integrally connected to the vertical extension portion and extending in a horizontal direction, parallel to the upper surface of the substrate.

According to an aspect of embodiments, a semiconductor device includes a substrate including an active region having a first impurity region and a second impurity region; a sacrificial pattern layer on the active region; a device isolation layer defining the active region and having an upper surface, coplanar with an upper surface of the sacrificial pattern layer; a word line structure extending in a first horizontal direction and having an upper surface, coplanar with the upper surface of the sacrificial pattern layer; a bit line structure on the substrate and extending in a second horizontal direction, intersecting the first horizontal direction; a bit line contact electrically connecting the first impurity region and the bit line structure; and a storage node contact on a side surface of the bit line contact and electrically connected to the second impurity region, wherein the storage node contact includes a horizontal extension portion contacting an upper surface of the second impurity region and extending in a horizontal direction, parallel to an upper surface of the substrate.

According to an aspect of embodiments, a semiconductor device includes a substrate including an active region having a first impurity region and a second impurity region; a sacrificial pattern layer on the active region; a device isolation layer defining the active region and having an upper surface, coplanar with an upper surface of the sacrificial pattern layer; a word line structure extending in a first horizontal direction and having an upper surface, coplanar with the upper surface of the sacrificial pattern layer; a bit line structure on the substrate and extending in a second horizontal direction, intersecting the first horizontal direction; and a bit line contact electrically connecting the first impurity region and the bit line structure, wherein the sacrificial pattern layer includes a portion on the first impurity region, contacting a side surface of the bit line contact, and the sacrificial pattern layer includes at least one of a metal, a metal oxide, a metal nitride, or silicon germanium.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, preferred embodiments will be described with reference to the accompanying drawings.

Figure 1A:
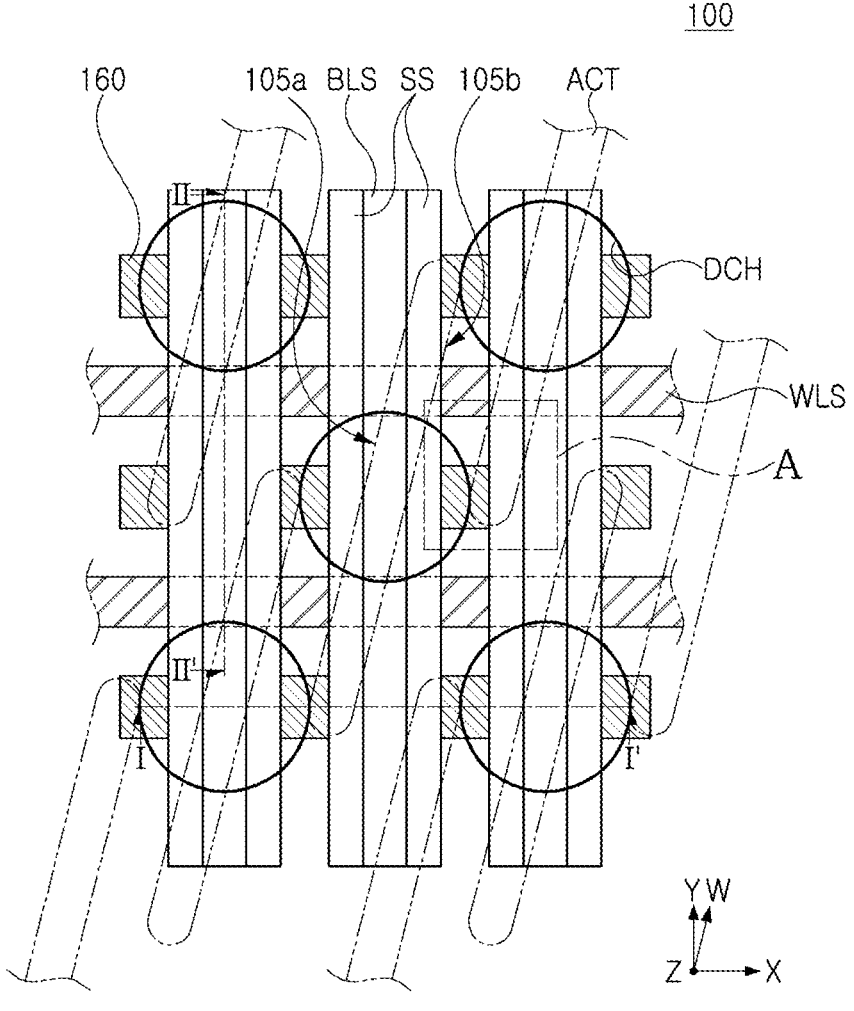
FIGS. 1A and 1B are schematic plan views of a semiconductor device according to example embodiments.
Figure 1B:
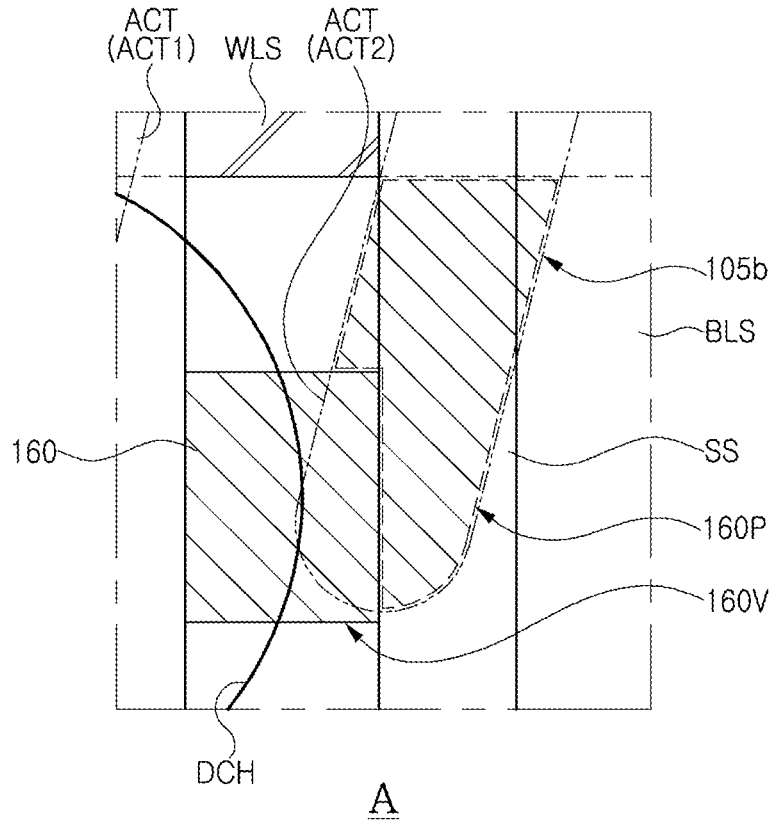
Figure 2:
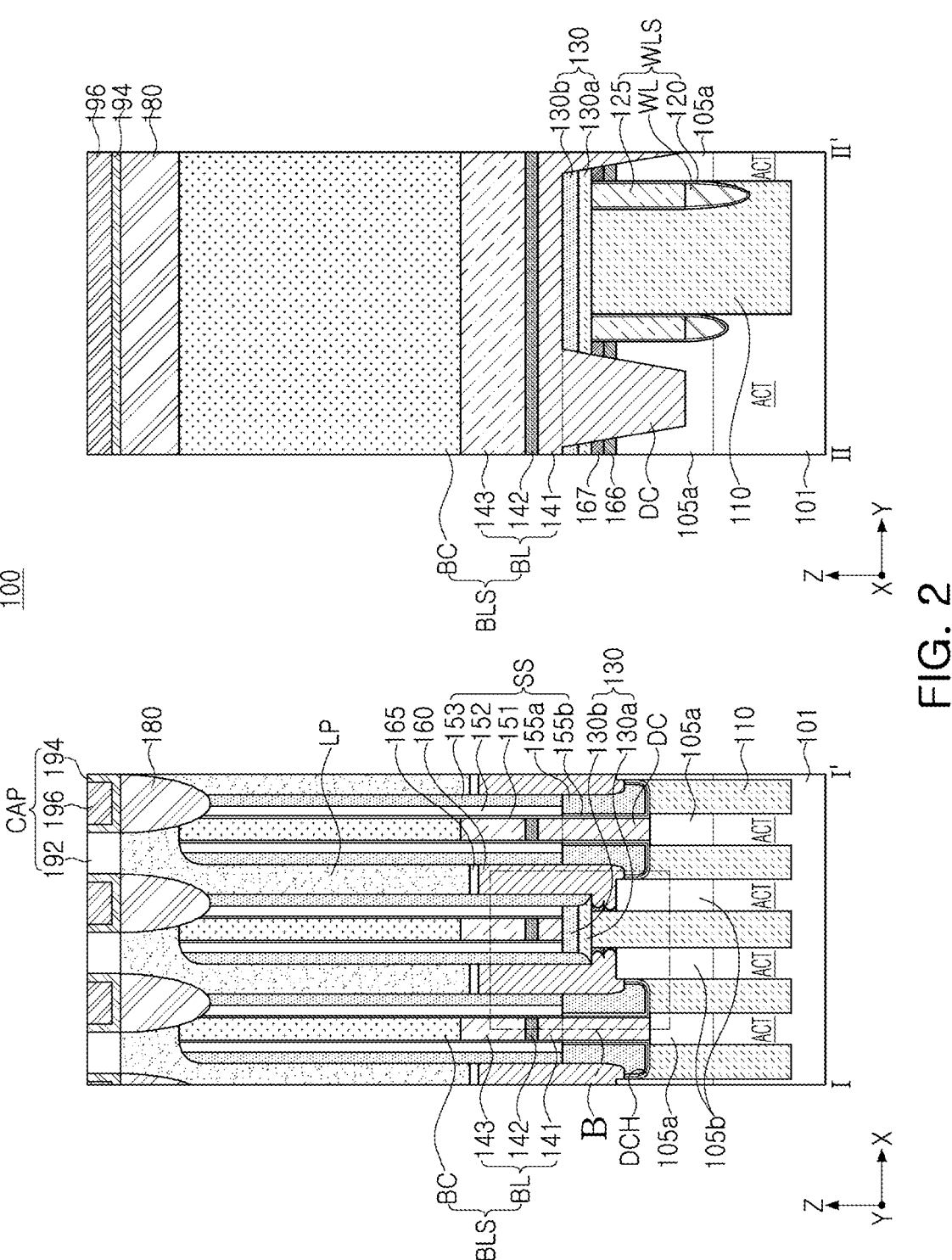
FIG. 2 illustrates schematic cross-sectional views of a semiconductor device according to example embodiments.
Figure 3:
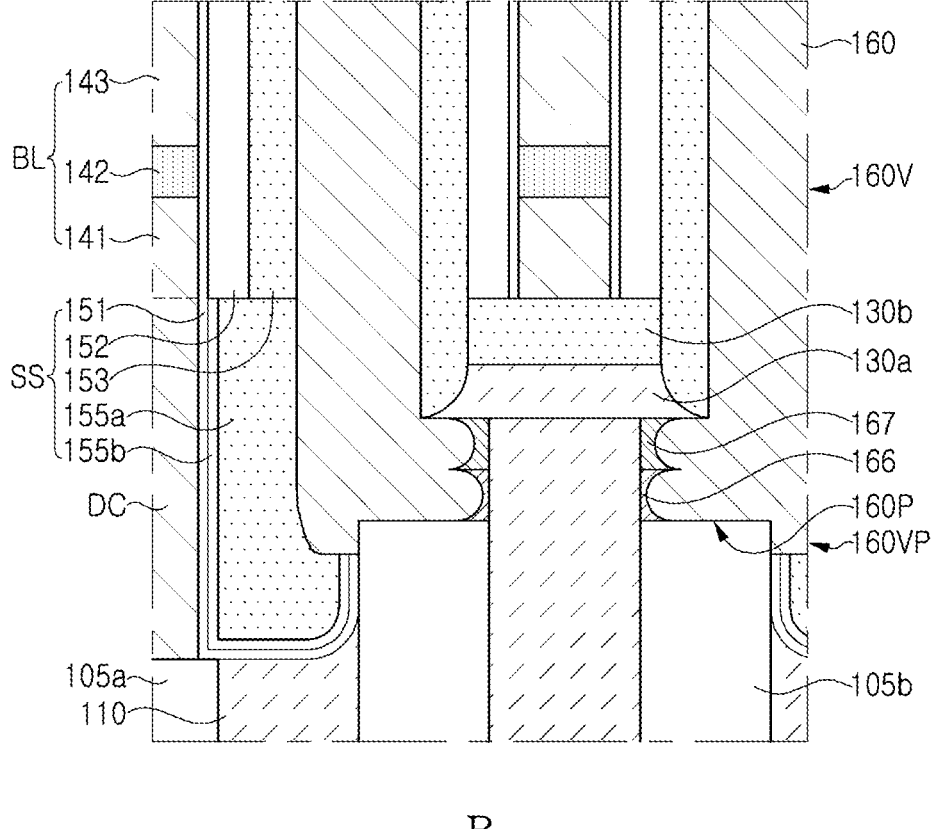
FIG. 3 is a partially enlarged cross-sectional view of a semiconductor device according to example embodiments.

FIG. 1A is a schematic plan view of a semiconductor device according to example embodiments, FIG. 1B is an enlarged view of portion 'A' of FIG. 1A, FIG. 2 illustrates schematic cross-sectional views along lines I-I' and II-II' of FIG. 1A, and FIG. 3 is a partially enlarged cross-sectional view of portion 13' of FIG. 2.

Referring to FIGS. 1A to 3, a semiconductor device 100 may include a substrate 101 including an active region ACT, sacrificial pattern layers 166 and 167 on the active region ACT, a device isolation layer 110 defining the active region ACT, a word line structure WLS embedded in and extended into the substrate 101 and including a word line WL, a bit line structure BLS on the substrate 101 to extend across the word line structure WLS and including a bit line BL, a bit line contact DC electrically connecting the bit line structure BLS and the active region ACT, a spacer structure SS on both sides of the bit line structure BLS, a capacitor structure CAP disposed on the bit line structure BLS, a storage node contact 160 electrically connecting the capacitor structure CAP and the active region ACT, a landing pad LP electrically connecting the storage node contact 160 and the capacitor structure CAP, and a capping insulating layer 180 on the bit line structure BLS. The semiconductor device 100 may further include a buffer layer 130 on the substrate 101, and a metal-semiconductor layer 165 on the storage node contact 160. For example, the semiconductor device 100 may be applied to cell array of a dynamic random access memory (DRAM).

The substrate 101 may have an upper surface extending in X and Y-directions. The substrate 101 may include a semiconductor material, e.g., a group IV semiconductor, a group III-V compound semiconductor, or a group II-VI compound semiconductor. For example, the group IV semiconductor may include silicon, germanium, or silicon-germanium. The substrate 101 may include, e.g., a silicon substrate, a silicon-on-insulator (SOI) substrate, a germanium substrate, a germanium-on-insulator (GOI) substrate, a silicon-germanium substrate, or a substrate including an epitaxial layer.

The active region ACT may be defined by the device isolation layer 110. The active region ACT may have a bar shape, and may be disposed in an island shape extending in one direction, e.g., a W direction, in the substrate 101. The W direction may be inclined with respect to extension directions of the word line WL and the bit line BL.

The active region ACT may have first and second impurity regions 105a and 105b at a predetermined depth from the upper surface of the substrate 101. The first and second impurity regions 105a and 105b may be spaced apart from each other. The first and second impurity regions 105a and 105b may serve as source/drain regions of a transistor. For example, a drain region may be formed between two word lines WL crossing one active region ACT, and a source region may be formed outside the two word lines WL, respectively. For example, the first impurity region 105a may correspond to the source region, and the second impurity region 105b may correspond to the drain region. The source region and the drain region may be formed by first and second impurity regions 105a and 105b by doping or ion implantation of substantially identical impurities, and may be interchanged according to a circuit configuration of a transistor finally formed. The impurities may include dopants having a conductivity type, opposite to that of the substrate 101. In example embodiments, depths of the first and second impurity regions 105a and 105b in the source region and the drain region may be different from each other.

The device isolation layer 110 may be formed by a shallow trench isolation (STI) process. The device isolation layer 110 may separate the active regions ACT from each other while surrounding each of the active regions ACT. The device isolation layer 110 may be formed of an insulating material, e.g., an oxide, a nitride, or a combination thereof. In an example embodiment, the device isolation layer 110 may include a plurality of layers.

An upper surface of the device isolation layer 110 may be located on a level higher than an upper surface of the active region ACT, e.g., an uppermost surface of the device isolation layer 110 may be at a level higher than an uppermost surface of the active region ACT. In this specification, high and low degrees of the term "level" are defined based on (e.g., relative to) the lower surface of the substrate 101, which is substantially flat. Therefore, the device isolation layer 110 may include a portion protruding from, e.g., above, the active region ACT in a Z direction.

The sacrificial pattern layers 166 and 167 may be disposed on the active region ACT, and the sacrificial pattern layers 166 and 167 may not be disposed on the device isolation layer 110. Upper surfaces of the sacrificial pattern layers 166 and 167 may be located on a level substantially equal to the upper surface of the device isolation layer 110. The upper surfaces of the sacrificial pattern layers 166 and 167 may be coplanar with the upper surface of the device isolation layer 110. This is because the sacrificial pattern layers 166 and 167 may be formed by selectively removing a portion of the active region ACT from the device isolation layer 110 by a predetermined depth. A portion of the sacrificial pattern layers 166 and 167 may be replaced with a horizontal extension portion 160P of the storage node contact 160, to provide a region in which the horizontal extension portion 160P is formed, or may be layers for self-aligning a bit line contact hole DCH.

In an example embodiment, the sacrificial pattern layers 166 and 167 may include a first sacrificial layer 166 and a second sacrificial layer 167, sequentially stacked on the active region ACT. The first sacrificial layer 166 may include an oxide, e.g., silicon oxide or the like. The second sacrificial layer 167 may include a material different from components adjacent to the second sacrificial layer 167, e.g., a material different from materials of each of the active region ACT, the device isolation layer 110, and the spacer structure SS. This may be to form the horizontal extension portion 160P by selectively removing the second sacrificial layer 167 with respect to the adjacent components under a specific etching condition. The second sacrificial layer 167 may include at least one of a metal, a metal oxide, a metal nitride, or a semiconductor material, and may include, e.g., titanium nitride (TiN). Also, the semiconductor material may be a material different from that of the substrate 101. Although the first sacrificial layer 166 and the second sacrificial layer 167 are illustrated as having a substantially equal thickness, a thickness of the first sacrificial layer 166 may be thinner than a thickness of the second sacrificial layer 167. In an example embodiment, the first sacrificial layer 166 may be an auxiliary layer for preventing formation of a silicide layer between the second sacrificial layer 167 and the substrate 101.

The word line structure WLS may extend in a first horizontal direction, e.g., in the X direction. The word line structure WLS may include a gate dielectric layer 120, a word line WL, and a buried insulating layer 125.

The word line WL may be disposed in gate trenches extending into the substrate 101. The word line WL may be disposed to extend in the X direction crossing the active regions ACT in the substrate 101. For example, a pair of word lines WL may be disposed to cross one active region ACT. Transistors including the word line WL and the first and second impurity regions 105a and 105b, respectively, may constitute a buried channel array transistor (BCAT), but are not limited thereto.

The word line WL may be disposed below, e.g., at a lower portion of, the gate trenches by a predetermined thickness. An upper surface of the word line WL may be located on a level lower than the upper surface of the substrate 101. The word line WL may be formed of a conductive material, e.g., at least one of polycrystalline silicon (Si), titanium (Ti), titanium nitride (TiN), tantalum (Ta), tantalum nitride (TaN), tungsten (W), tungsten nitride (WN), or aluminum (Al). In example embodiments, the word line WL may include a plurality of layers.

The gate dielectric layer 120 may be disposed on bottom and inner side surfaces of the gate trenches. The gate dielectric layer 120 may conformally cover inner side walls of the gate trenches. The gate dielectric layer 120 may be disposed between the word line WL and the active region ACT. The gate dielectric layer 120 may include at least one of an oxide, a nitride, or an oxynitride. The gate dielectric layer 120 may be, e.g., a silicon oxide layer or an insulating layer having a high dielectric constant. In example embodiments, the gate dielectric layer 120 may be a layer formed by oxidizing the active region ACT, or may be a layer formed by deposition.

The buried insulating layer 125 may be disposed on the word line WL and fill the gate trenches. The buried insulating layer 125 may be formed of an insulating material, e.g., as a silicon nitride film.

An upper surface of the buried insulating layer 125 may be located at a level substantially equal to the upper surface of the device isolation layer 110. The upper surface of the buried insulating layer 125 may be located at a level higher than the upper surface of the active region ACT, and may be located at a level substantially equal to the upper surfaces of the sacrificial pattern layers 166 and 167. For example, an upper surface of the word line structure WLS may be coplanar with the upper surfaces of the sacrificial pattern layers 166 and 167.

The sacrificial pattern layers 166 and 167 may include a portion of a side surface of the word line structure WLS on the first impurity region 105a. For example, the sacrificial pattern layers 166 and 167 may contact a side surface of the buried insulating layer 125 on the first impurity region 105a.

The buffer layer 130 may be disposed on the active region ACT, the device isolation layer 110, and the sacrificial pattern layers 166 and 167. The buffer layer 130 may cover the word line structures WLS. The buffer layer 130 may be disposed between the substrate 101 and the bit line structures BLS. The storage node contact 160 may pass through the buffer layer 130, and may be electrically connected to the active region ACT. The buffer layer 130 may include an insulating material, e.g., silicon oxide, silicon nitride, silicon oxynitride, or a combination thereof.

In an example embodiment, the buffer layer 130 may include a first buffer layer 130a and a second buffer layer 130b. For example, the first buffer layer 130a may include silicon oxide, and the second buffer layer 130b may include silicon nitride. According to embodiments, the buffer layer 130 may have three or more layers, or may include other materials.

The bit line structure BLS may extend in a second horizontal direction, intersecting the first horizontal direction, e.g., in a Y-direction. The bit line structure BLS may include a bit line BL and a bit line capping pattern BC on the bit line BL.

The bit line BL may be disposed on the buffer layer 130. The bit line BL may include a first conductive pattern 141, a second conductive pattern 142, and a third conductive pattern 143, sequentially stacked. The buffer layer 130 may be disposed between the first conductive pattern 141 and the substrate 101. The first conductive pattern 141 may include a semiconductor material, e.g., polycrystalline silicon. The second conductive pattern 142 may include a metal-semiconductor compound. For example, the metal-semiconductor compound may be provided as a layer in which a portion of the first conductive pattern 141 is silicided. For example, the metal-semiconductor compound may include cobalt silicide (CoSi), titanium silicide (TiSi), nickel silicide (NiSi), tungsten silicide (WSi), or other metal silicides, or may include a nitride, e.g., TiSiN. The third conductive pattern 143 may include a metal material, e.g., titanium (Ti), tantalum (Ta), tungsten (W), or aluminum (Al). The number of conductive patterns, types of materials, and/or a stacking order constituting the bit line BL may be variously changed according to embodiments.

The bit line capping pattern BC may be disposed on the third conductive pattern 143. The bit line capping pattern BC may include an insulating material, e.g., a silicon nitride film. The number of insulating patterns, types of materials, and/or a stacking order constituting the bit line capping pattern BC may be variously changed according to embodiments. Also, even though the bit line capping pattern BC includes a plurality of material layers and the plurality of material layers include the same material, a boundary may be distinguished due to a difference in properties.

The bit line contact DC may pass through the buffer layer 130 to contact the first impurity region 105a of the active region ACT. The bit line BL may be electrically connected to the first impurity region 105a through the bit line contact DC. The bit line contact DC may be locally disposed in the bit line contact hole DCH exposing the first impurity region 105a.

For example, the bit line contact hole DCH may be formed as a hole type, e.g., an opening or a cavity with a circular planar cross section, exposing the first impurity region 105a, as illustrated in FIGS. 1A and 1B. In another example, the bit line contact hole DCH may be formed as a trench type or as a reverse type. The reverse type may refer to a shape of an opening formed by disposing mask patterns spaced apart from each other in a region other than the first impurity region 105a, and then performing an etching process.

The bit line contact DC may have a shape including a portion integrally connected to the bit line BL and extending into the bit line contact hole DCH. Therefore, the bit line contact DC may include the same material as the first conductive pattern 141 of the bit line BL, e.g., polycrystalline silicon. A lower surface of the bit line contact DC may be located at a level lower than the upper surface of the substrate 101, and may be located at a level higher than the upper surface of the word line WL, e.g., the lower surface of the bit line contact DC may be at a height level between the upper surface of the substrate 101 and the upper surface of the word line WL along the Z direction. The bit line contact DC may be spaced apart from the storage node contact 160 by the spacer structure SS.

Referring to FIG. 2, the sacrificial pattern layers 166 and 167 may include a portion on the first impurity region 105a that contacts a portion of a side surface of the bit line contact DC, e.g., a portion of each of the sacrificial pattern layers 166 and 167 may directly contact the side surface of the bit line contact DC. This may be because portions of the sacrificial pattern layers 166 and 167 formed on the first impurity region 105a remain in a process of forming the bit line contact hole DCH on the first impurity region 105a.

The spacer structures SS may be disposed on both, e.g., opposite, sidewalls of the bit line structure BLS, and may extend in the second horizontal direction, e.g., in the Y-direction. The spacer structures SS may be disposed between the bit line structure BLS and the storage node contact 160. The spacer structures SS may be disposed to extend along sidewalls of the bit line BL and sidewalls of the bit line capping pattern BC. A pair of spacer structures SS disposed on both sides of one bit line structure BLS may have an asymmetrical shape with respect to the bit line structure BLS. The asymmetrical shape may be formed by the capping insulating layer 180. The spacer structures SS may further include portions disposed on both sidewalls of the bit line contact DC and filling the bit line contact hole DCH.

The spacer structure SS may include a first spacer 151, a second spacer 152, and a third spacer 153, sequentially stacked on the sidewalls of the bit line structure BLS. The first spacer 151 may include a first portion for conformally covering the bit line capping pattern BC and the bit line BL on the sidewalls of the bit line structures BLS. The first spacer 151 may further include a second portion extending along both sidewalls of the bit line contact DC from the first portion and conformally covering a bottom surface and an inner wall of the bit line contact hole DCH. The first spacer 151 may include an insulating material, e.g., silicon nitride. The second spacer 152 may be disposed between the first spacer 151 and the third spacer 153. The second spacer 152 may be, e.g., an air spacer. When the second spacer 152 is an air spacer, an upper end of the second spacer 152 may be defined by the capping insulating layer 180 disposed thereon, and the upper end may be also defined by the landing pad LP. The third spacer 153 may be disposed on a sidewall of the second spacer 152, and may include an insulating material, e.g., silicon nitride or silicon oxynitride.

In an example embodiment, the spacer structure SS may further include lower spacers 155a and 155b disposed in the bit line contact hole DCH. The lower spacers 155a and 155b may fill the bit line contact hole DCH while covering the first spacer 151 extending into the bit line contact hole DCH. The lower spacers 155a and 155b may include a first lower spacer 155a and a second lower spacer 155b formed between the first lower spacer 155a and the first spacer 151 to have a predetermined thickness. The first lower spacer 155a may include, e.g., silicon nitride, and the second lower spacer 155b may include, e.g., silicon oxide.

Materials and the number of layers of the first to third spacers 151, 152, and 153 and materials and the number of layers of the lower spacers 155a and 155b may be variously changed.

In an example embodiment, insulating patterns disposed on the buffer layer 130 may be further included. The insulating patterns may be spaced apart from each other in one direction, e.g., the Y-direction, between adjacent bit line structures BLS. The insulating patterns may include portions overlapping word line structures WLS, when viewed in a plan view. The insulating patterns may include, e.g., silicon nitride.

The storage node contact 160 may be connected to one region of the active region ACT, e.g., to the second impurity region 105b. In an example embodiment, the number of storage node contacts 160 may be plural. As illustrated in FIG. 1A, each of the storage node contacts 160 may be disposed between bit line structures BLS adjacent to each other in the X direction, e.g., between facing spacer structures SS of adjacent ones of the bit line structures BLS, when viewed in a plan view. When viewed in a plan view, each of the storage node contacts 160 may be disposed between the word line structures WLS and the bit line structures BLS. Each of the storage node contacts 160 may fill at least a portion of a space defined by the bit line structures BLS adjacent in the X direction and the insulating patterns adjacent in the Y-direction. The storage node contacts 160 may be arranged in columns and rows in the X- and Y-directions.

The storage node contact 160 may pass through the buffer layer 130 to contact the second impurity region 105b of the active region ACT, to electrically connect the active region ACT and the capacitor structure CAP. The storage node contact 160 may be in direct contact with the second impurity region 105b. A lower end of the storage node contact 160 may be located at a level lower than the upper surface of the substrate 101 and may be located on a level higher than a bottom surface of the bit line contact DC, e.g., a lowermost surface of the storage node contact 160 may be at a height level between height levels of the uppermost surface of the substrate 101 and a lowermost surface of the bit line contact DC in the Z direction. The storage node contact 160 may be insulated from the bit line contact DC by the first spacer 151 and the lower spacers 155a and 155b.

The storage node contact 160 may be formed of a conductive material, e.g., polycrystalline silicon (Si), titanium (Ti), titanium nitride (TiN), tantalum (Ta), tantalum nitride (TaN), tungsten (W), tungsten nitride (WN), or aluminum (Al). In an example embodiment, the storage node contact 160 may include a plurality of layers.

The metal-semiconductor layer 165 may be disposed between the storage node contact 160 and the landing pad LP. The metal-semiconductor layer 165 may cover an upper surface of the storage node contact 160. The metal-semiconductor layer 165 may be, e.g., a layer in which a portion of the storage node contact 160 is silicided. For example, the metal-semiconductor layer 165 may include cobalt silicide (CoSi), titanium silicide (TiSi), nickel silicide (NiSi), tungsten silicide (WSi), or other metal silicide. According to embodiments, the metal-semiconductor layer 165 may be omitted.

The landing pad LP may electrically connect the storage node contact 160 and the capacitor structure CAP. The landing pad LP may be disposed between the pair of bit line structures BLS and on the storage node contact 160. The landing pad LP may cover an upper surface of the metal-semiconductor layer 165. The landing pad LP may be in contact with sidewalls of the spacer structures SS between the spacer structures SS. The landing pad LP may pass through the capping insulating layer 180, and may be in contact with the capping insulating layer 180.

In an example embodiment, the landing pad LP may be provided as a plurality of landing pads LP, and the plurality of landing pads LP may be arranged in a grid pattern having a hexagonal or honeycomb shape. Arrangement of the plurality of landing pads LP may correspond to arrangement of the capacitor structures CAP.

In an example embodiment, the landing pad LP may have a double-layer structure including a conductive layer and a barrier layer covering lower and side surfaces of the conductive layer. The conductive layer may include a conductive material, e.g., at least one of polycrystalline silicon (Si), titanium (Ti), tantalum (Ta), tungsten (W), or aluminum (Al), and the barrier layer may include a metal nitride, e.g., at least one of titanium nitride (TiN), tantalum nitride (TaN), or tungsten nitride (WN). According to embodiments, the number and a shape of the landing pad LP may be variously changed.

The capping insulating layer 180 may be disposed on the insulating pattern and the bit line structure BLS. The capping insulating layer 180 may be disposed to contact the bit line structure BLS, the spacer structure SS, and the landing pad LP. In an example embodiment, the capping insulating layer 180 may be disposed between a plurality of landing pads LP. The capping insulating layer 180 may have a lower end contacting an upper surface of the spacer structure SS.

Each of the capacitor structures CAP may be disposed on the capping insulating layer 180 and the landing pad LP. Each of the capacitor structures CAP may include a lower electrode 192, a capacitor dielectric layer 194, and an upper electrode 196. In an example embodiment, the lower electrode 192 may have a columnar shape contacting the landing pad LP, the upper electrode 196 may cover the lower electrode 192 having a columnar shape, and the capacitor dielectric layer 194 may be disposed between the lower electrode 192 and the upper electrode 196. As such, the capacitor structure CAP may have a pillar shape, but is not limited thereto, e.g., may have a cylinder shape. The lower electrode 192 and the upper electrode 196 may include at least one of a doped semiconductor, a metal nitride, a metal, or a metal oxide. The lower electrode 192 and the upper electrode 196 may include, e.g., at least one of polycrystalline silicon, titanium nitride (TiN), tungsten (W), titanium (Ti), ruthenium (Ru), or tungsten nitride (WN). For example, the capacitor dielectric layer 194 may include at least one of high-κ materials, e.g., zirconium oxide (ZrO$_2$), aluminum oxide (Al$_2$O$_3$), or hafnium oxide (Hf$_2$O$_3$).

Referring to FIGS. 1B, 2, and 3, the storage node contact 160 may include a vertical extension portion 160V extending in the Z direction between adjacent bit line structures BLS, and a horizontal extension portion 160P extending in a horizontal direction, parallel to the upper surface of the substrate 101. The horizontal direction may be, e.g., the W direction, which may be a direction in which the active region ACT extends. The horizontal extension portion 160P may be integrally connected to the vertical extension portion 160V to extend in the horizontal direction, e.g., as a single and indivisible structure. The term "integrally connected" refers to elements that are formed of a same material in a same process into a single structure that is seamless and indivisible.

The horizontal extension portion 160P may be located at a level lower than a lower surface of the bit line structure BLS, and may be located at a level higher than the lower surface of the bit line contact DC, e.g., an entirety of the horizontal extension portion 160P may be between the lower surface of the bit line structure BLS and the lower surface of the bit line contact DC in the Z direction. In an example embodiment, the horizontal extension portion 160P may be located at a level substantially equal to the sacrificial pattern layers 166 and 167. For example, an upper surface of the horizontal extension portion 160P may be located at a level substantially equal to the upper surface of the device isolation layer 110, and a lower surface of the horizontal extension portion 160P may be located at a level substantially equal to the upper surface of the active region ACT. In other words, upper surfaces of the horizontal extension portion 160P, device isolation layer 110, and the second sacrificial layer 167 may be coplanar with each other, and lower surfaces of the horizontal extension portion 160P and the first sacrificial layer 166 may be coplanar with each other. This is because the horizontal extension portion 160P is formed by replacing some of the sacrificial pattern layers 166 and 167 with the horizontal extension portion 160P.

The horizontal extension portion 160P may be in contact with at least a portion of the upper surface of the active region ACT. As a contact area with the active region ACT is uniformly secured through the horizontal extension portion 160P, a semiconductor device in which distribution characteristics of transistors are improved and having improved electrical characteristics may be provided. For example, compared to a storage node contact including only a vertical extension portion (i.e., without the horizontal extension portion 160P), the storage node contact 160 contacts not only the side surface of the active region ACT but also the upper surface of the active region ACT (i.e., via the horizontal extension portion 160P). Therefore, a semiconductor device in which a relatively large contact area is secured and having improved electrical characteristics may be provided. Also, since a length of the horizontal extension portion 160P according to process conditions may be adjusted to adjust a contact area between the active region ACT and the storage node contact 160, a semiconductor device having improved distribution characteristics may be provided.

Referring to FIG. 1B, the entirety of the horizontal extension portion 160P may overlap the second impurity region 105b of the active region ACT in the Z direction. This is because the horizontal extension portion 160P is formed to replace at least a portion of the sacrificial pattern layers 166 and 167 on the second impurity region 105b. Therefore, at least a portion of the horizontal extension portion 160P may overlap the spacer structure SS in the Z direction. For example, as illustrated in FIG. 2, at least a portion of the horizontal extension portion 160P may overlap the, e.g., bottom of the, second spacer 152 of the spacer structure SS in the Z direction (e.g., in a top view).

In an example embodiment, referring to FIG. 3, some of the sacrificial pattern layers 166 and 167 on the second impurity region 105b may remain without being replaced with the horizontal extension portion 160P, and may be in contact with the horizontal extension portion 160P. In an example embodiment, the horizontal extension portion 160P may have a shape that is convex toward the remaining sacrificial pattern layers 166 and 167, e.g., a surfaces of the horizontal extension portion 160P facing the sacrificial pattern layers 166 and 167 may bulge (e.g., curve) toward the sacrificial pattern layers 166 and 167. The convex shape may include a first convex portion that is convex toward the first sacrificial layer 166, and a second convex portion that is convex toward the second sacrificial layer 167. Shapes (e.g., curvatures, extended lengths, or the like) of the first convex portion and the second convex portion may be the same as or different from each other, and may be variously changed according to embodiments. This is because the first convex portion and the second convex portion are formed by separate processes.

The vertical extension portion 160V may have a protrusion 160VP protruding at a level lower than a lower surface of the horizontal extension portion 160P, e.g., the protrusion 160VP may protrude toward the device isolation layer 110 and extend beyond the lower surface of the horizontal extension portion 160P. The protrusion 160VP may be in contact with the lower spacers 155a and 155b or the first spacer 151. The protrusion 160VP may have a smaller width, e.g., in the X direction, than other portions of the vertical extension portion 160V, and may extend in the Z direction, e.g., toward the device isolation layer 110. The protrusion 160VP may be a portion corresponding to an opening region extending by a predetermined depth with respect to a portion in which the sacrificial pattern layers 166 and 167 are not disposed, while etching the sacrificial pattern layers 166 and 167, in a process of forming an opening OP (FIG. 5I). In the above process, as a width of the opening region is relatively narrowed by the sacrificial pattern layers 166 and 167, a height of a lower end of the protrusion 160VP may be formed to be relatively high. Therefore, a depth of the bit line contact hole DCH or the height of the lower end of the bit line contact DC may be formed relatively high. This is because the depth of the bit line contact hole DCH is adjusted according to a depth of the storage node contact 160 disposed to be spaced apart from the bit line contact DC. For example, the depth of the bit line contact hole DCH may be formed relatively thin by the sacrificial pattern layers 166 and 167, and thus a semiconductor device having improved productivity may be provided.

Referring to FIG. 1B, the bit line contact hole DCH may expose the second impurity region 105b of an adjacent active region ACT. A spacer structure SS filling the bit line contact hole DCH may have a portion contacting the exposed second impurity region 105b. The horizontal extension portion 160P may be located at a level higher than the portion of the spacer structure SS.

For example, the active region ACT may include a first active region ACT1 and a second active region ACT2, spaced apart from each other. The spacer structure SS disposed on a sidewall of the bit line contact DC connected to the first impurity region 105a of the first active region ACT1 may include a portion contacting a side surface of the second active region ACT2, e.g., a side surface of the second impurity region 105b of the second active region ACT2. This is because, referring to FIG. 5F, in an etching process for forming the bit line contact hole DCH, a portion of the active region ACT below the sacrificial pattern layers 166 and 167 is not removed and remains, and a portion of a side surface is exposed by the sacrificial pattern layers 166 and 167. In the etching process, the bit line contact hole DCH may be formed to be self-aligned while having a relatively large planar area by the sacrificial pattern layers 166 and 167. Therefore, a semiconductor device having improved productivity may be provided.

Next, various modifications of embodiments will be described with reference to FIGS. 4A to 4E. FIGS. 4A to 4E are partially enlarged cross-sectional views of a semicon-ductor device according to example embodiments and cor-respond to FIG. 3.

Figure 4A:
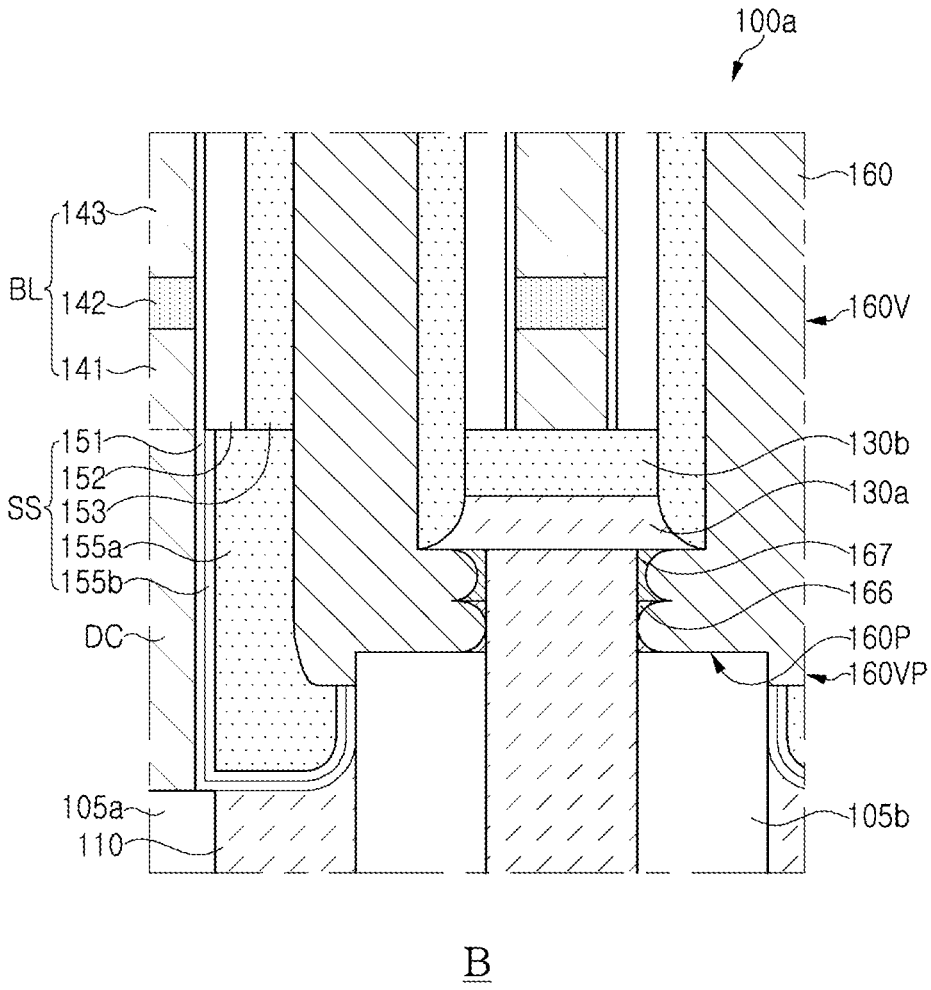
FIGS. 4A, 4B, 4C, 4D and 4E are partially enlarged cross-sectional views of a semiconductor device according to example embodiments.

Referring to FIG. 4A, in a semiconductor device 100a, a horizontal extension portion 160P may be in contact with a side surface of a device isolation layer 110. For example, the horizontal extension portion 160P may be in contact with a side portion of the device isolation layer 110 protruding above an upper surface of an active region ACT. This structure may be formed by removing at least a portion of the sacrificial pattern layers 166 and 167 to etch the sacri-ficial pattern layers 166 and 167 relatively more in a process of forming a tunnel portion TL (FIG. 5J).

Figure 4B:
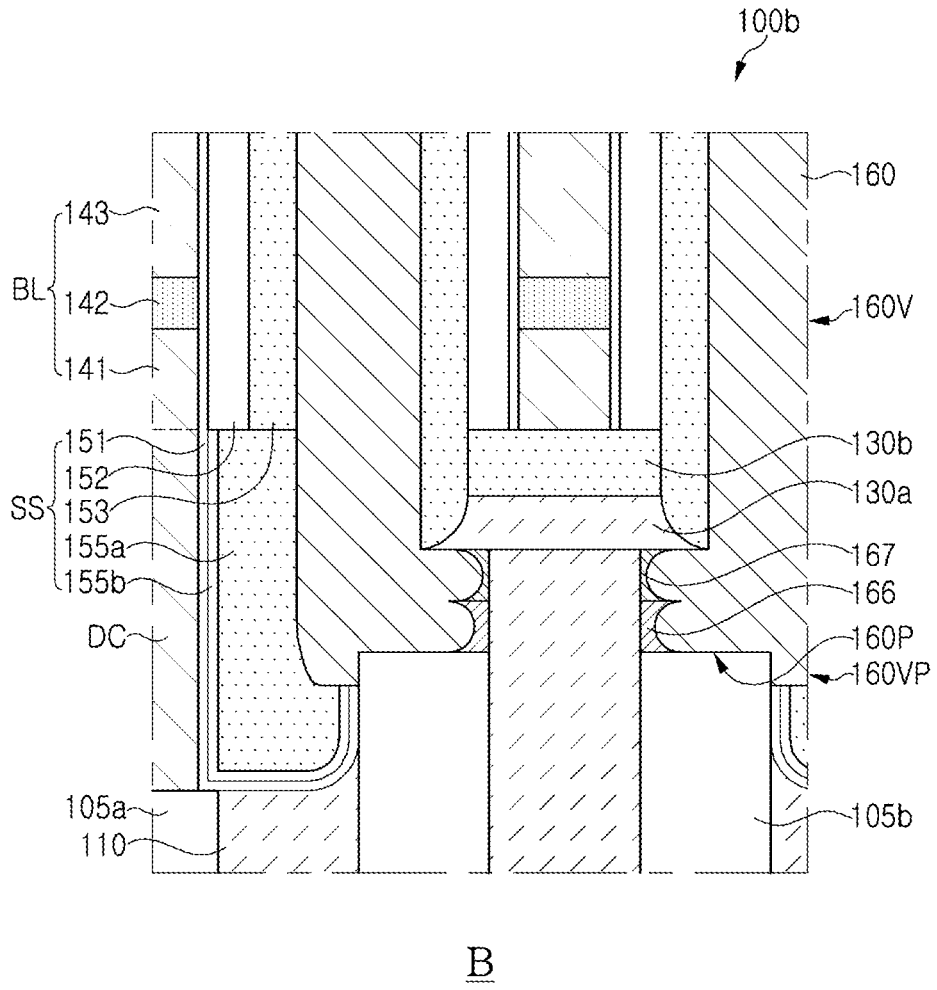

Referring to FIG. 4B, in a semiconductor device 100b, a horizontal extension portion 160P may include a first convex portion that is convex toward the first sacrificial layer 166, and a second convex portion that is convex toward the second sacrificial layer 167, and a length of the second convex portion may be longer than a length of the first convex portion, e.g., in the X direction. Also, among the sacrificial pattern layers 166 and 167 remaining on the second impurity region 105b, a length of the first sacrificial layer 166 may be longer than a length of the second sacrificial layer 167. This is because the first convex portion and the second convex portion are formed by removing the first sacrificial layer 166 and the second sacrificial layer 167 by separate etching processes.

Figure 4C:
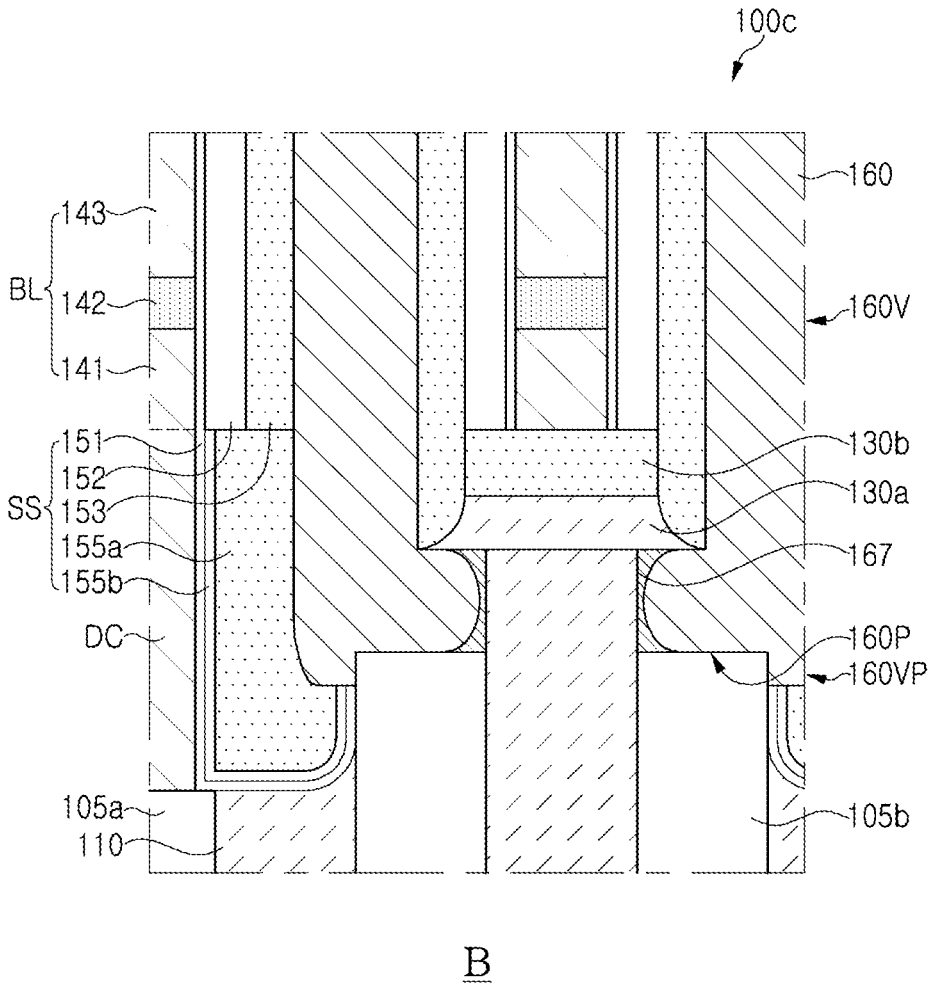

Referring to FIG. 4C, in a semiconductor device 100c, a sacrificial pattern layer may be formed as a single layer. For example, the sacrificial pattern layer may include only the second sacrificial layer 167 (i.e., without the first sacrificial layer 166). A horizontal extension portion 160P may extend in the horizontal direction at a level equal to the second sacrificial layer 167, and may include only one convex portion that is convex toward the second sacrificial layer 167.

Figure 4D:
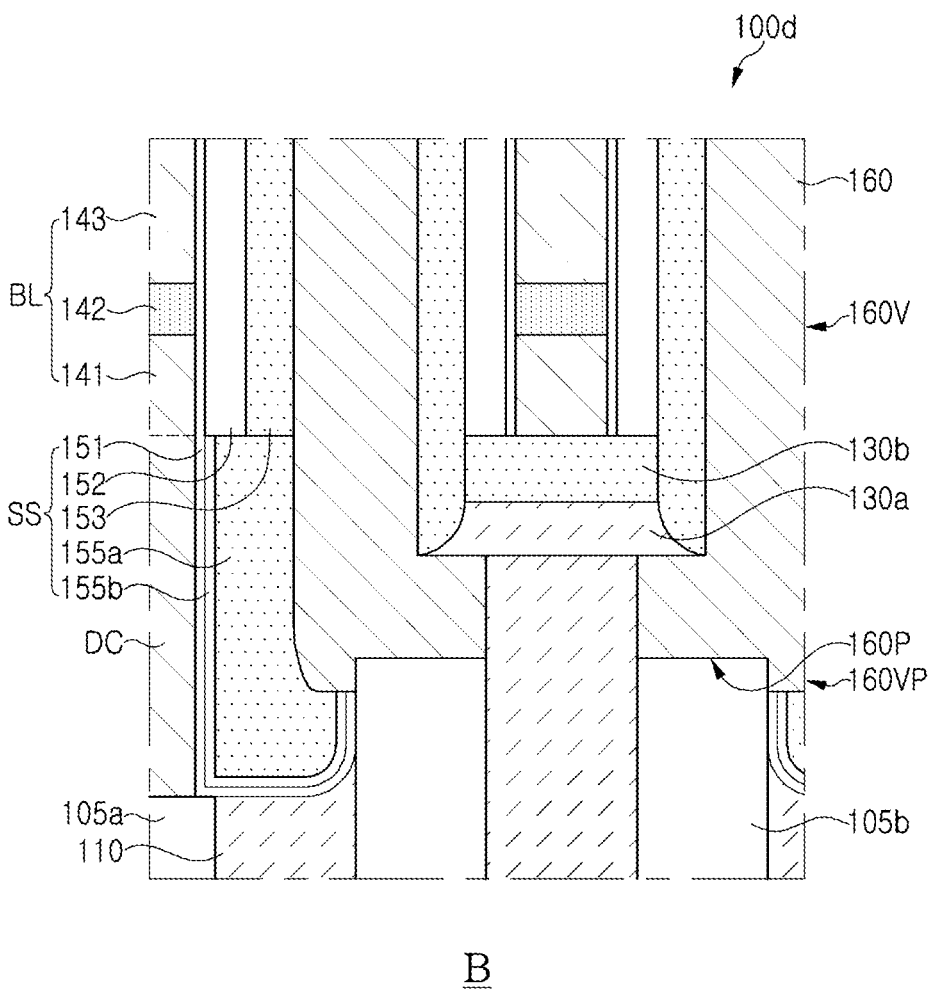

Referring to FIG. 4D, in a semiconductor device 100d, sacrificial pattern layers 166 and 167 may not remain on the second impurity region 105b. For example, a horizontal extension portion 160P may be disposed to completely overlap the second impurity region 105b of the active region ACT in the Z direction on the active region ACT (see FIG. 2). Even in this case, the sacrificial pattern layers 166 and 167 on the first impurity region 105a may remain. This may be because the sacrificial pattern layers 166 and 167 on the first impurity region 105a are not removed by a buried insulating layer 125 (see FIG. 2) in a process of forming a tunnel portion TL (FIG. 5J).

Figure 4E:
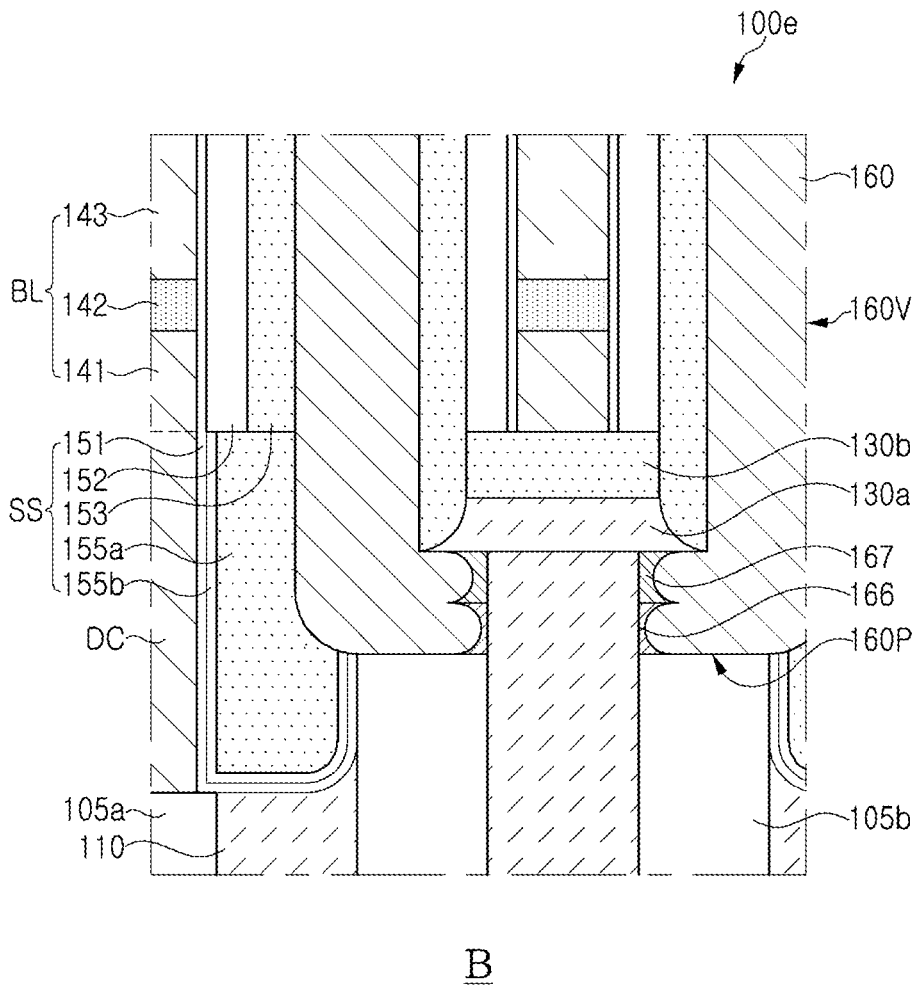

Referring to FIG. 4E, in a semiconductor device 100e, the vertical extension portion 160V may not include a protru-sion (i.e., the 160VP of FIG. 3). This may be a structure formed as the materials and structures of the spacer structure SS or the materials and structures of the sacrificial pattern layers 166 and 167 are changed. Therefore, a lower end of the vertical extension portion 160V may be disposed at a level that is substantially equal to the horizontal extension portion 160P.

Next, a method of manufacturing a semiconductor device according to embodiments will be described with reference to FIGS. 5A to 5K. FIGS. 5A to 5K are schematic cross-sectional views of stages in a method of manufacturing a semiconductor device according to example embodiments.

Figure 5A:
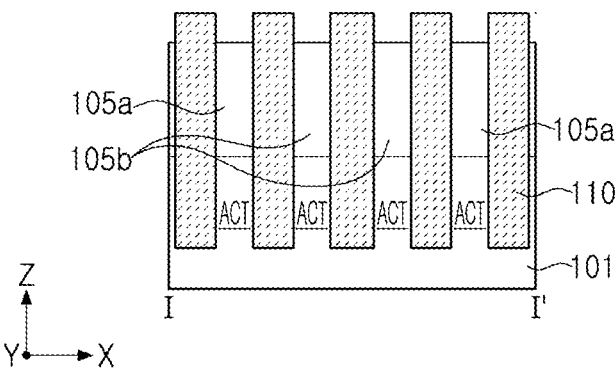
FIGS. 5A, 5B, 5C, 5D, 5E, 5F, 5G, 5H, 5I, 5J and 5K are schematic cross-sectional views illustrating stages in a method of manufacturing a semiconductor device according to example embodiments.

Referring to FIG. 5A, the device isolation layer 110 defining the active region ACT may be formed in the substrate 101, the word line structure WLS (see FIG. 2) may be formed in the substrate 101, and a portion of the substrate 101 may be removed.

First, according to a shallow trench isolation (STI) pro-cess, the substrate 101 may be anisotropically etched to form trenches, insulating materials may be deposited in the trenches, and then a planarization process may be performed to form the device isolation layer 110. The first and second impurity regions 105a and 105b may be formed by putting, e.g., implanting, impurities into the substrate 101, before forming the device isolation layer 110. According to example embodiments, the first and second impurity regions 105a and 105b may be formed after the device isolation layer 110 is formed or may be formed by a different process.

Next, the substrate 101 may be anisotropically etched to form gate trenches in which the word line WL (see FIG. 2) is disposed. The gate trenches may extend in the X direction, and may cross the active region ACT and the device isola-tion layer 110. In the gate trenches, the gate dielectric layer 120 (see FIG. 2), the word line WL, and the buried insulating layer 125 (see FIG. 2) may be sequentially formed. The gate dielectric layer 120 may be formed to have a substantially uniform thickness on inner walls and bottom surfaces of the gate trenches. The gate dielectric layer 120 may be formed by an oxidation process of the active region ACT or a deposition process of a dielectric material. The word line WL may be formed by depositing a conductive material in the gate trenches and recessing the same from an upper portion by a predetermined depth. The buried insulating layer 125 may be formed by depositing an insulating mate-rial to fill a remaining portion of the gate trench and then performing a planarization process. As a result, the word line structure WLS may be formed.

Next, an etching process may be performed to selectively remove the substrate 101 with respect to the word line structure WLS and the device isolation layer 110. In the etching process, a portion of the substrate 101 may be removed to partially recess the same from the word line structure WLS and the device isolation layer 110 such that an upper surface of the active region ACT is formed at a level lower than an upper surface of the word line structure WLS and an upper surface of the device isolation layer 110.

Figure 5B:
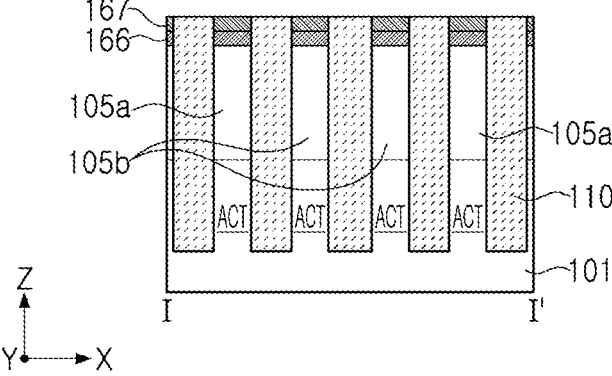

Referring to FIG. 5B, the sacrificial pattern layers 166 and 167 may be formed. For example, the sacrificial pattern layers 166 and 167 may be formed on the active regions ACT between portions of the device isolation layer 110.

In detail, the first sacrificial layer 166 may be formed to have a substantially uniform thickness on the active region ACT by an oxidation process of the active region ACT. For example, the first sacrificial layer 166 may include silicon oxide. The first sacrificial layer 166 may be disposed in a region recessed from the device isolation layer 110.

After performing a deposition process to fill the recessed region, a planarization process may be performed to form the second sacrificial layer 167 having an upper surface, coplanar with the upper surface of the device isolation layer 110 and the upper surface of the word line structure WLS. The second sacrificial layer 167 may include at least one of a metal, a metal oxide, a metal nitride, or a semiconductor material, different from that of the substrate 101. The second sacrificial layer 167 may include, e.g., titanium nitride (TiN). Thus, the sacrificial pattern layers 166 and 167 may be formed.

In this operation, filling the recessed region with the second sacrificial layer 167 and forming the first sacrificial layer 166 may be omitted to form the semiconductor device of FIG. 4C by a subsequent process.

Figure 5C:
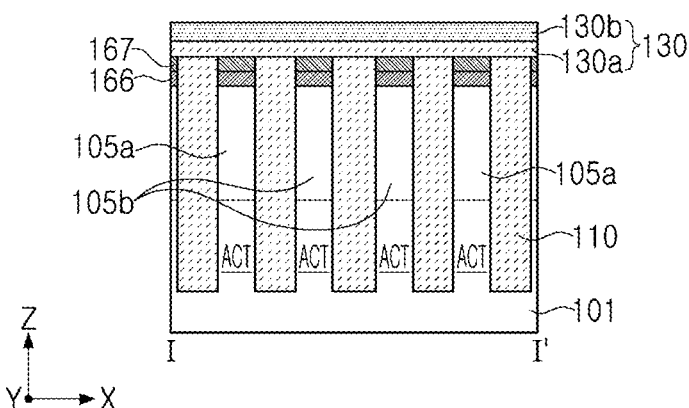

Referring to FIG. 5C, the buffer layer 130 may be formed. The buffer layer 130 may be formed by performing a deposition process on an upper surface on which the sacrificial pattern layers 166 and 167, the device isolation layer 110, and the word line structure WLS are formed. The buffer layer 130 may be formed to have a uniform thickness on the flat upper surface. The buffer layer 130 may include, e.g., at least one of SiN, SiOC, SiO, SiCN, SiON, or SiOCN. In an example embodiment, the buffer layer 130 may be prepared by forming the first buffer layer 130a containing silicon oxide and forming the second buffer layer 130b containing silicon nitride.

Figure 5D:
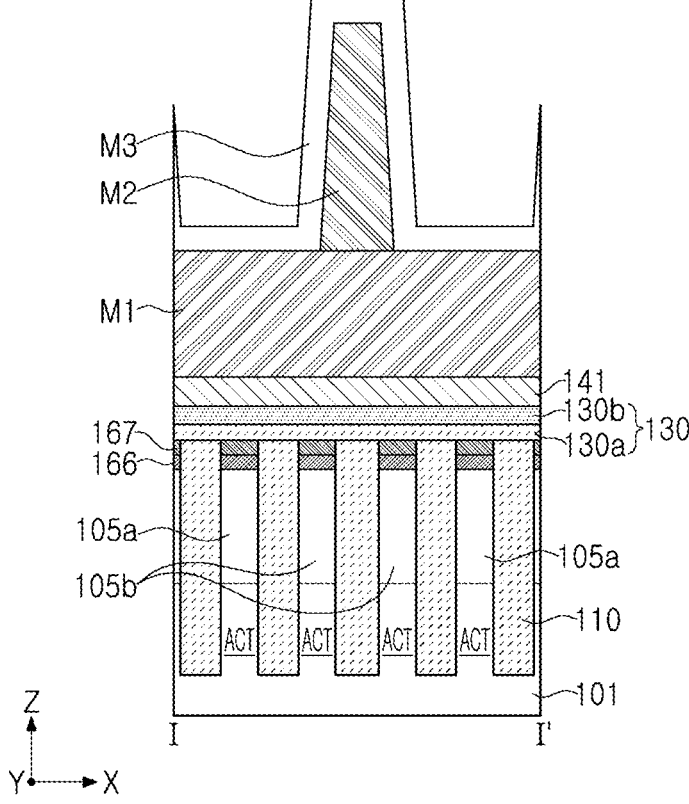

Referring to FIG. 5D, a first conductive pattern 141 and first to third masks M1, M2, and M3 may be formed.

In detail, a conductive material may be deposited on the buffer layer 130 to form the first conductive pattern 141. The conductive material may include, e.g., polycrystalline silicon. The first mask M1 and the second mask M2 may be sequentially deposited and formed on the first conductive pattern 141. The first mask M1 may include an oxide-based material, and the second mask M2 may include an organic material, e.g., photoresist. Next, after the second mask M2 is etched by a patterning process, the third mask M3 may be deposited to have a substantially uniform thickness. The third mask M3 may be formed to cover side and upper surfaces of the second mask M2 and an upper surface of the first mask M1 exposed by patterning the second mask M2. The third mask M3 may be, e.g., an oxide layer formed by an atomic layer deposition process.

Figure 5E:
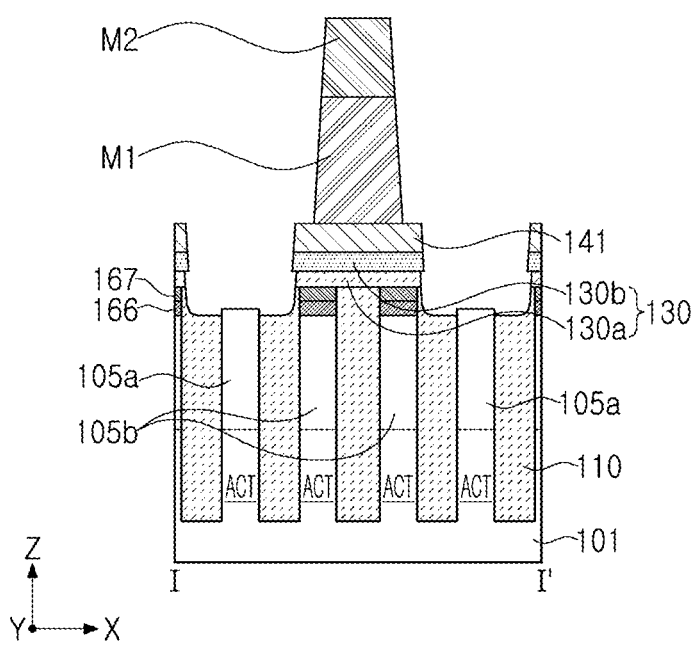

Referring to FIG. 5E, an opening may be formed by patterning the first conductive pattern 141 and the buffer layer 130 by an etching process, and the first impurity region 105a of the active region ACT may be exposed by a cleaning process.

The opening penetrating the first conductive pattern 141 and the buffer layer 130 may be formed by the etching process using the first to third masks M1, M2, and M3. In this operation, the opening may pass through the second sacrificial layer 167, and may not pass through the first sacrificial layer 166. According to other embodiments, the opening may pass through both the first sacrificial layer 166 and the second sacrificial layer 167. As the third mask M3 is disposed to surround a sidewall of the first mask M1, the sacrificial pattern layers 166 and 167 on the second impurity region 105b may be protected without being removed in the above process.

Next, the cleaning process may be performed to remove a portion of the third mask M3 and a portion of the second mask M2, and a portion of the device isolation layer 110 and the first sacrificial layer 166 on the first impurity region 105a may be removed to expose the first impurity region 105a.

Figure 5F:
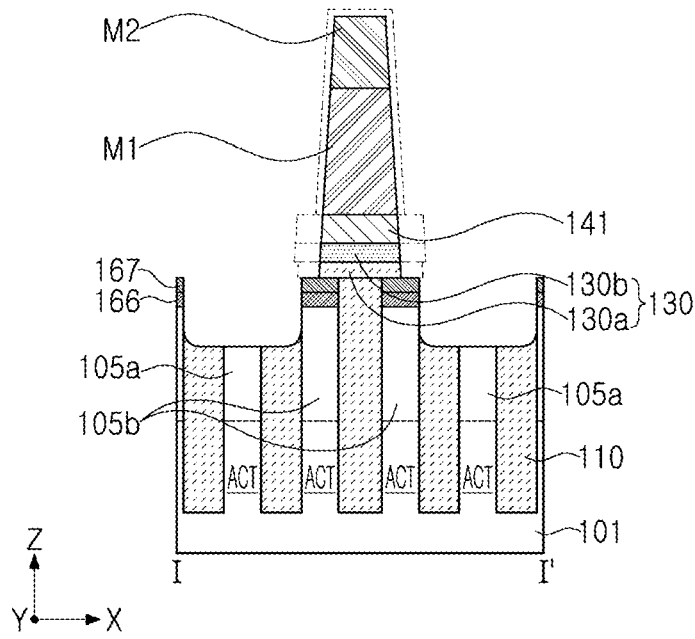

Referring to FIG. 5F, an etching process may be performed to expose upper surfaces of the sacrificial pattern layers 166 and 167 on the second impurity region 105b. The etching process may be performed as a dry etching process.

In this operation, the first conductive pattern 141 and the buffer layer 130 along with the first and second masks M1 and M2 may be additionally removed to expose the upper surfaces of the sacrificial pattern layers 166 and 167. Among the sacrificial pattern layers 166 and 167, the second sacrificial layer 167 may not be removed or may be removed only in a small amount as it contains a material having relatively high etching resistance, e.g., selectivity, in the etching process. Therefore, the upper surface of the second sacrificial layer 167 may be exposed. As a size of the opening increases by the etching process, a portion of a side surface of the second impurity region 105b may be exposed. As the sacrificial pattern layers 166 and 167 disposed on the upper surface of the second impurity region 105b protect the second impurity region 105b therebelow, the second impurity region 105b may not be removed or may be removed only in a small amount in the etching process.

In addition, side surfaces of the sacrificial pattern layers 166 and 167 may be exposed by the etching process, but the size of the opening may be adjusted as the sacrificial pattern layers 166 and 167 serve as a buffer layer. The opening may be self-aligned by the sacrificial pattern layers 166 and 167, and the opening formed in this operation may correspond to the bit line contact hole DCH of FIG. 1A. A size of the bit line contact hole DCH may be controlled by the sacrificial pattern layers 166 and 167, such that a semiconductor device having improved productivity may be provided.

Figure 5G:
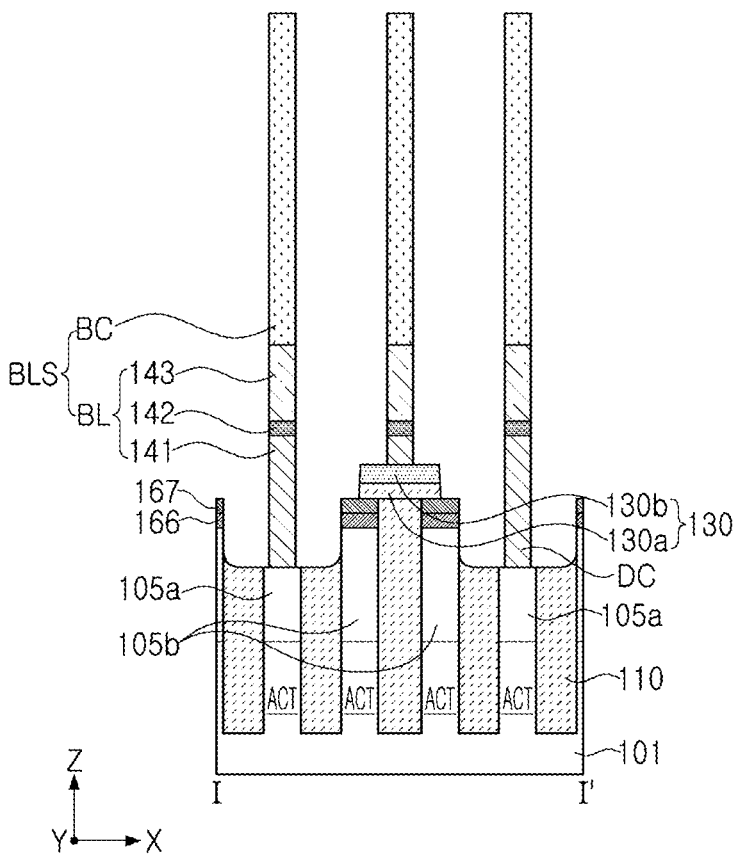

Referring to FIG. 5G, a bit line contact DC and a bit line structure BLS may be formed.

After removing the first and second masks M1 and M2 and filling the same conductive material as the first conductive pattern 141, a planarization process may be performed, and layers forming a bit line BL and a bit line capping pattern BC may be sequentially stacked and then patterned to form the bit line contact DC and the bit line structure BLS. The bit line contact DC may be a portion integrally connected to the first conductive pattern 141 and disposed in the opening.

Figure 5H:
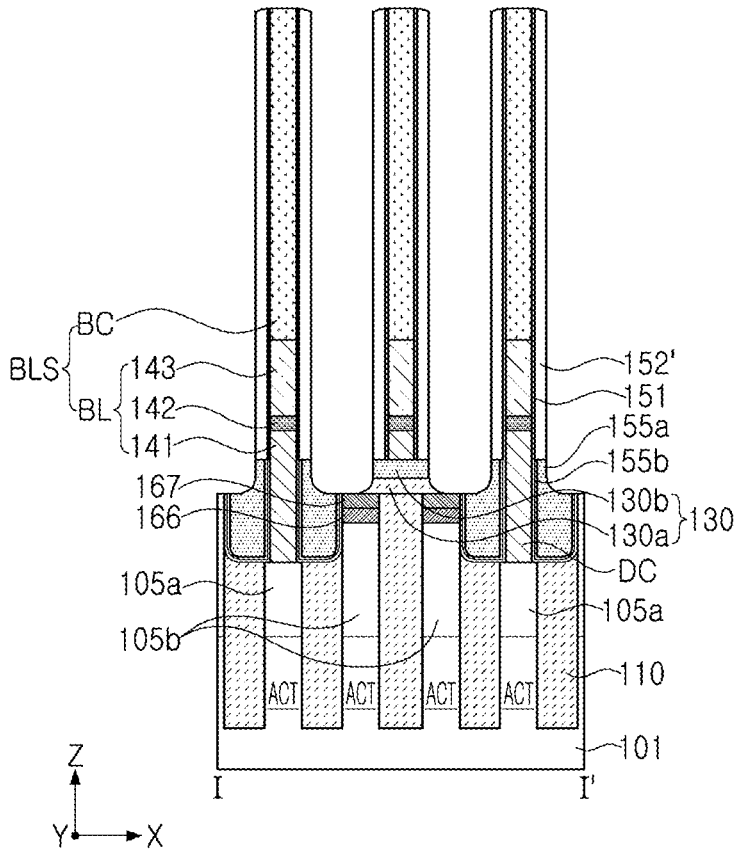
Figure 5I:
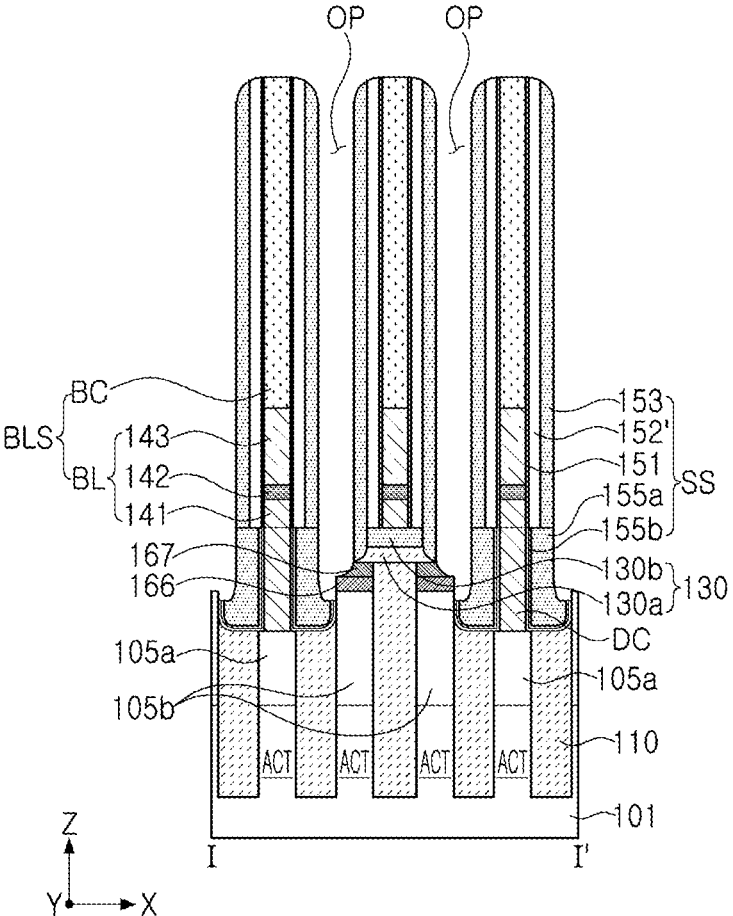
Figure 5J:
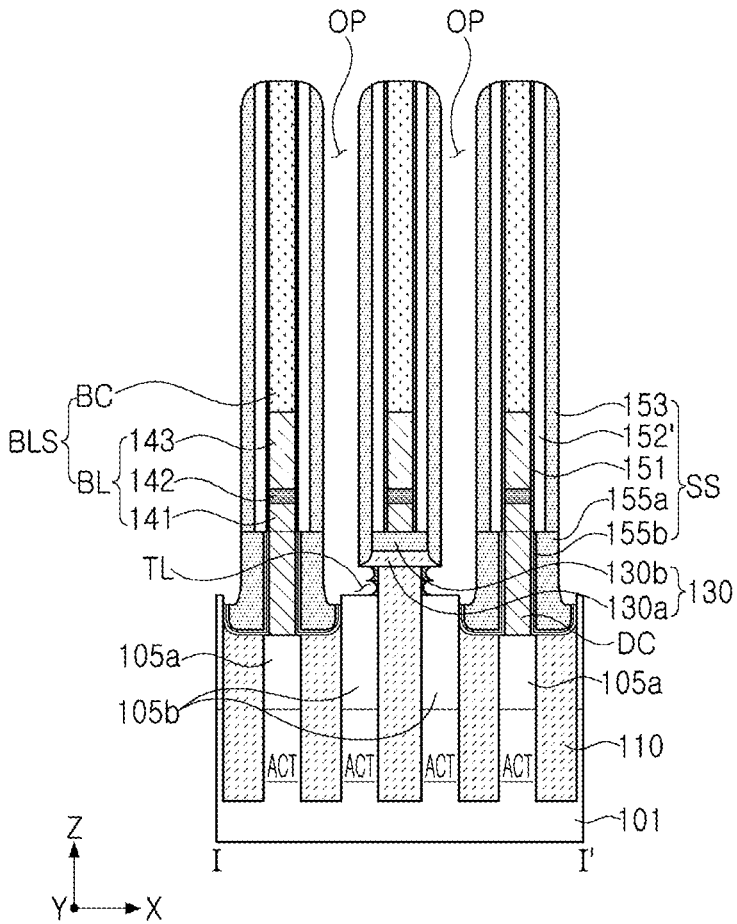

Referring to FIG. 5H, a first spacer 151 covering a sidewall of the bit line structure BLS and a sidewall of the bit line contact DC, a sacrificial spacer 152', and lower spacers 155a and 155b may be formed.

A deposition process may be performed to form the first spacer 151 covering the sidewall of the bit line structure BLS and the sidewall of the bit line contact DC and a bottom surface and an inner wall of the opening. The deposition process may be performed by, e.g., an atomic layer deposition (ALD) process or a chemical vapor deposition process. Next, the lower spacers 155a and 155b having upper surfaces substantially on a level, equal to an upper surface of the buffer layer 130, may be sequentially formed while filling the opening, and then a deposition process and an etching process may be performed to form the sacrificial spacer 152' disposed on a sidewall of the first spacer 151, on the lower spacers 155a and 155b. A portion of the buffer layer 130 may be removed by an etching process. The first spacer 151 may include silicon nitride, and the sacrificial spacer 152' may include silicon oxide. The sacrificial spacer 152' may be replaced with a second spacer 152 by a subsequent process.

Referring to FIG. 5I, an opening OP exposing a third spacer 153 and the second sacrificial layer 167 may be formed.

After depositing an insulating material to cover a side surface of the sacrificial spacer 152' and a side surface of the buffer layer 130, an anisotropic etching process may be performed to form the third spacer 153 and the opening OP.

The insulating material may include, e.g., silicon nitride. The opening OP may expose an upper surface of the second sacrificial layer 167. In an example embodiment, the opening OP may include a first opening region contacting the upper surface of the second sacrificial layer 167, and a second opening region passing through the lower spacers 155*a* and 155*b* without contacting the second sacrificial layer 167 to extend a predetermined depth, deeper than the first opening region. In the etching process, the second sacrificial layer 167 may serve as a buffer layer, and a depth of the second opening region may be relatively reduced, compared to a case without the second sacrificial layer 167. The opening OP may partially expose the first sacrificial layer 166 or the second impurity region 105*b* according to the depth of the second opening region, but is not limited thereto.

Referring to FIG. 5J, a tunnel portion TL may be formed by removing the first sacrificial layer 166 and the second sacrificial layer 167 on the second impurity region 105*b*.

At least a portion of the second sacrificial layer 167 on the second impurity region 105*b* may be removed by performing an etching process to selectively remove the second sacrificial layer 167 exposed through the opening OP with respect to the third spacer 153 or the like. Next, as the first sacrificial layer 166 is removed, at least a portion of the first sacrificial layer 166 on the second impurity region 105*b* may be removed by performing an etching process to selectively remove the first sacrificial layer 166 exposed through the opening OP with respect to the third spacer 153 or the like. Therefore, the tunnel portion TL extending in the horizontal direction may be formed. The horizontal direction may be, e.g., the W direction in which the active region ACT of FIG. 1A extends, and the tunnel portion TL may expose an upper surface of the second impurity region 105*b*. A size of the tunnel portion TL may be adjusted according to process conditions of etching processes for removing the sacrificial pattern layers 166 and 167. Therefore, an area of the exposed upper surface of the second impurity region 105*b* may be uniformly adjusted with adjacent active regions ACT. Since an exposed area of the active region ACT by the tunnel portion TL may relatively increase and the exposed area may be uniformly adjusted in the etching process, a semiconductor device having improved electrical characteristics between the active region ACT and a storage node contact 160 may be provided.

Figure 5K:
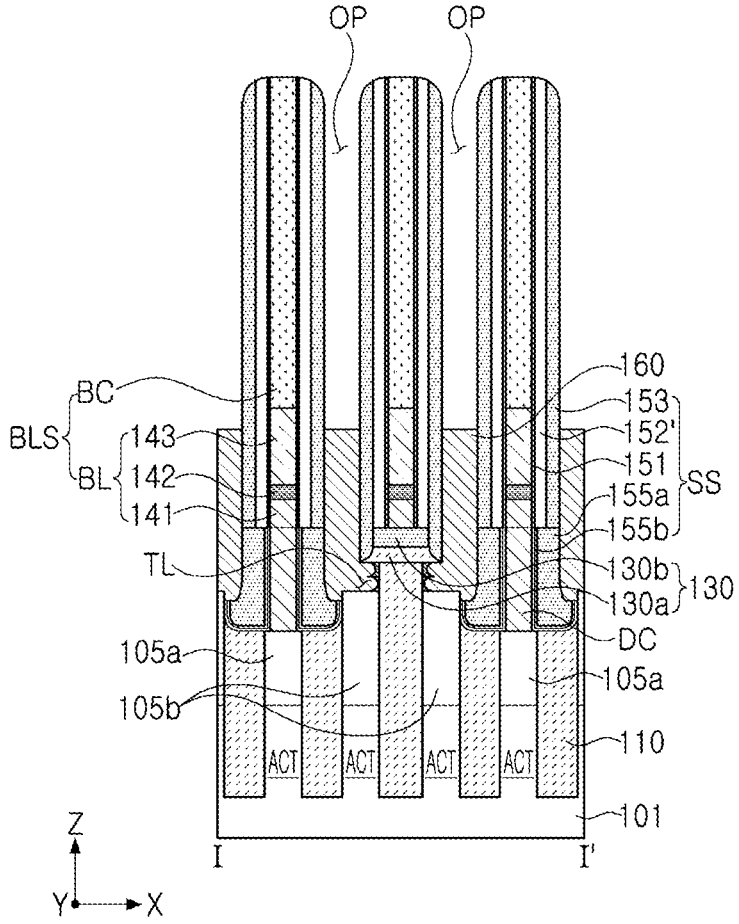

Referring to FIG. 5K, a storage node contact 160 having a horizontal extension portion 160P may be formed.

The storage node contact 160 may be formed by depositing a conductive material filling the opening OP and the tunnel portion TL. The storage node contact 160 may have the vertical extension portion 160V corresponding to the opening OP, and a horizontal extension portion 160P corresponding to the tunnel portion TL. The horizontal extension portion 160P may be in contact with the upper surface of the second impurity region 105*b* of the active region ACT.

Next, referring to FIG. 2, a metal-semiconductor layer 165 and a landing pad LP may be formed on an upper surface of the storage node contact 160, and the landing pad LP may be etched to remove an exposed sacrificial spacer 152', and a capping insulating layer 180 may be formed to define the second spacer 152. Next, a planarization process and/or an etch-back process may be performed to remove a portion of the capping insulating layer 180, and then a capacitor structure CAP may be formed on the landing pad LP. As a result, the semiconductor device 100 of FIGS. 1A to 3 may be manufactured.

By way of summation and review, embodiments provide a semiconductor device having improved electrical characteristics or productivity. That is, as a storage node contact having a horizontal extension portion contacting an upper surface of an active region may be provided to uniformly secure a contact area between the active region and the storage node contact, a semiconductor device having improved distribution characteristics and electrical characteristics may be provided. In addition, a bit line contact hole structure may be self-aligned by a sacrificial pattern layer to provide a semiconductor device having improved productivity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including an active region;
   a bit line structure on the substrate and extending in one direction;
   a bit line contact electrically connecting a first impurity region of the active region and the bit line structure; and
   a storage node contact on a sidewall of the bit line structure and electrically connected to a second impurity region of the active region, the storage node contact including:
      a vertical extension portion extending in a vertical direction, the vertical direction being perpendicular to an upper surface of the substrate, and
      a horizontal extension portion integrally connected to the vertical extension portion and extending in a horizontal direction, the horizontal direction being parallel to the upper surface of the substrate.

2. The semiconductor device as claimed in claim 1, wherein the horizontal extension portion is at a level lower than a lower surface of the bit line structure.

3. The semiconductor device as claimed in claim 1, wherein the horizontal extension portion is in contact with at least a portion of an upper surface of the active region.

4. The semiconductor device as claimed in claim 1, wherein an entirety of the horizontal extension portion overlaps the second impurity region of the active region in the vertical direction.

5. The semiconductor device as claimed in claim 1, further comprising a device isolation layer defining the active region, an upper surface of the device isolation layer being at a level higher than an upper surface of the active region.

6. The semiconductor device as claimed in claim 5, wherein:
   an upper surface of the horizontal extension portion is at a same level as the upper surface of the device isolation layer, and
   a lower surface of the horizontal extension portion is at a same level as the upper surface of the active region.

7. The semiconductor device as claimed in claim 5, further comprising a sacrificial pattern layer on the active region, an upper surface of the sacrificial pattern layer being coplanar with the upper surface of the device isolation layer, and the sacrificial pattern layer being in contact with the horizontal extension portion.

8. The semiconductor device as claimed in claim 7, wherein the sacrificial pattern layer includes at least one of a metal, a metal oxide, a metal nitride, or a semiconductor material that is different from a material of the substrate.

9. The semiconductor device as claimed in claim 5, wherein the horizontal extension portion is in contact with at least a portion of a side surface of the device isolation layer protruding from the active region in the vertical direction.

10. The semiconductor device as claimed in claim 1, wherein the vertical extension portion includes a protrusion protruding beyond a lower surface of the horizontal extension portion.

11. The semiconductor device as claimed in claim 10, further comprising a spacer structure surrounding a sidewall of the bit line contact, the spacer structure being in contact with the protrusion.

12. The semiconductor device as claimed in claim 1, further comprising a spacer structure between the bit line structure and the storage node contact, at least a portion of the horizontal extension portion overlapping the spacer structure in the vertical direction.

13. The semiconductor device as claimed in claim 12, wherein the spacer structure includes a first spacer, a second spacer, and a third spacer sequentially stacked on the sidewall of the bit line structure, the horizontal extension portion including a portion overlapping the second spacer in the vertical direction.

14. A semiconductor device, comprising:
a substrate including an active region, the active region having a first impurity region and a second impurity region;
a sacrificial pattern layer on the active region;
a device isolation layer defining the active region, an upper surface of the device isolation layer being coplanar with an upper surface of the sacrificial pattern layer;
a word line structure extending in a first horizontal direction, an upper surface of the word line structure being coplanar with the upper surface of the sacrificial pattern layer;
a bit line structure on the substrate and extending in a second horizontal direction, the second horizontal direction intersecting the first horizontal direction;
a bit line contact electrically connecting the first impurity region and the bit line structure; and
a storage node contact on a side surface of the bit line contact and electrically connected to the second impurity region, the storage node contact including a horizontal extension portion contacting an upper surface of the second impurity region and extending in the first horizontal direction.

15. The semiconductor device as claimed in claim 14, wherein the horizontal extension portion is at a same level as the sacrificial pattern layer.

16. The semiconductor device as claimed in claim 14, wherein the sacrificial pattern layer includes a portion on the first impurity region, the portion contacting the side surface of the bit line contact.

17. The semiconductor device as claimed in claim 14, wherein the sacrificial pattern layer includes a first layer and a second layer on the active region, the first layer including silicon oxide, and the second layer including at least one of a metal, a metal oxide, a metal nitride, or silicon germanium.

18. A semiconductor device, comprising:
a substrate including an active region, the active region having a first impurity region and a second impurity region;
a sacrificial pattern layer on the active region, the sacrificial pattern layer including at least one of a metal, a metal oxide, a metal nitride, or silicon germanium;
a device isolation layer defining the active region, an upper surface of the device isolation layer being coplanar with an upper surface of the sacrificial pattern layer;
a word line structure extending in a first horizontal direction, an upper surface of the word line structure being coplanar with the upper surface of the sacrificial pattern layer;
a bit line structure on the substrate and extending in a second horizontal direction, the second horizontal direction intersecting the first horizontal direction; and
a bit line contact electrically connecting the first impurity region and the bit line structure, the sacrificial pattern layer including a portion on the first impurity region that is in contact with a side surface of the bit line contact.

19. The semiconductor device as claimed in claim 18, wherein:
the active region includes a first active region and a second active region spaced apart from each other,
the bit line contact includes a first bit line contact connected to a first impurity region of the first active region, and
a first spacer structure disposed on a sidewall of the first bit line contact has a portion contacting a side surface of a second impurity region of the second active region, the first spacer structure being on a sidewall of the bit line structure.

20. The semiconductor device as claimed in claim 19, further comprising a storage node contact having:
a vertical extension portion on a sidewall of the first spacer structure and extending in a vertical direction, the vertical direction being perpendicular to an upper surface of the substrate, and
a horizontal extension portion integrally connected to the vertical extension portion and extending in a horizontal direction, the horizontal direction being parallel to the upper surface of the substrate, and the horizontal extension portion being at a level higher than a contact point between the first spacer structure and the second active region.

\* \* \* \* \*